United States Patent [19]

Naruke et al.

[11] Patent Number: 4,970,686

[45] Date of Patent: Nov. 13, 1990

[54] SEMICONDUCTOR MEMORY CELLS AND SEMICONDUCTOR MEMORY DEVICE EMPLOYING THE SEMICONDUCTOR MEMORY CELLS

[75] Inventors: Yasuo Naruke, Kawasaki; Thoru Mochizuki, Yokohama; Taira Iwase, Kawasaki; Masamichi Asano, Tokyo, all of Japan

[73] Assignee: Kabushiki Kaisha Toshiba, Kawasaki, Japan

[21] Appl. No.: 396,246

[22] Filed: Aug. 21, 1989

[30] Foreign Application Priority Data

Aug. 19, 1988 [JP] Japan .................... 63-204802

[51] Int. Cl.$^5$ ............................ G11C 17/16
[52] U.S. Cl. .................... 365/96; 365/225.7; 357/51
[58] Field of Search .............. 365/96, 225.7, 200; 357/DIG. 51

[56] References Cited

U.S. PATENT DOCUMENTS

| | | | |
|---|---|---|---|
| 4,223,277 | 9/1980 | Taylor et al. | 365/225.7 |
| 4,399,372 | 9/1983 | Tanimoto et al. | 365/200 |
| 4,494,220 | 1/1985 | Dumbri et al. | 345/225.7 |
| 4,546,455 | 10/1985 | Iwahashi et al. | 365/225.7 |
| 4,609,998 | 9/1986 | Basnyak et al. | 365/96 |
| 4,698,589 | 10/1987 | Blankenship et al. | 365/96 |

Primary Examiner—Joseph E. Clawson, Jr.
Attorney, Agent, or Firm—Foley & Lardner, Schwartz, Jeffery, Schwaab, Mack, Blumenthal & Evans

[57] ABSTRACT

A spare memory cell comprises a read FET (Field Effect Transistor), a fusing FET and a current fuse. The FETs are connected in series between a read data line and a low voltage source. The fuse is inserted between a series node of the FETs and a write data line. The fuse is molten when data is written to the spare memory cell. By applying a power source voltage to a control electrode of the fusing FET and by applying a voltage that is higher than the power source voltage to the write data line, the fusing FET is set to its secondary breakdown state. Under this state, a large current flows through the fusing FET to cut off the fuse, thus writing data to the spare memory cell.

10 Claims, 4 Drawing Sheets

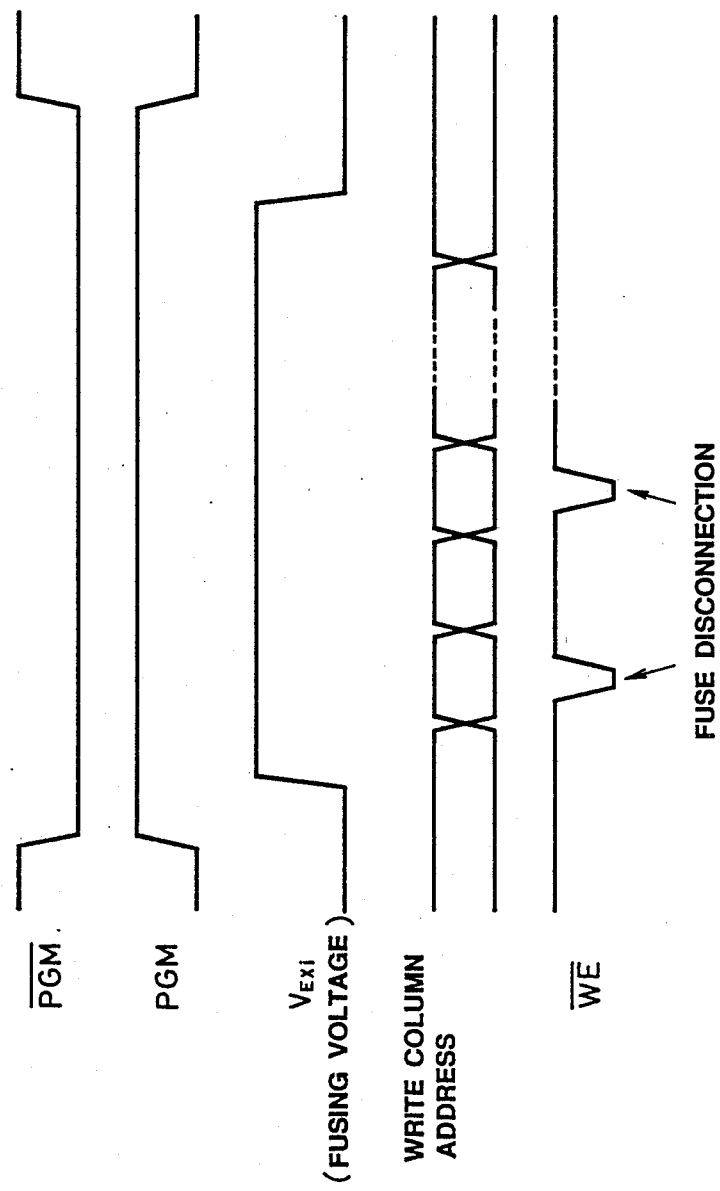

SEMICONDUCTOR MEMORY CELLS AND SEMICONDUCTOR MEMORY DEVICE EMPLOYING THE SEMICONDUCTOR MEMORY CELLS

BACKGROUND OF THE INVENTION

1. Field of the Invention

The present invention relates to a mask ROM of redundant configuration provided with spare memory cells. The spare memory cells are formed on the same chip of mask ROM on which normal memory cells are formed. When some of the normal memory cells are found to be faulty, they are substituted with the spare memory cells. The invention particularly relates to spare memory cells that can form redundancy of the mask ROM with excellent productivity and with small occupying areas.

2. Description of the Prior Art

Rapid progresses of semiconductor technologies of recent years have prompted high integration and high function of semiconductor integrated circuits. Particularly, progresses in integration of semiconductor memory devices are remarkable.

If the surface area of a semiconductor chip is increased for the purpose of high integration, yield of the chip tends to decrease to deteriorate productivity. To solve this problem, redundant configuration is effective for, for instance, memories. The redundant configuration provides spare memory cells on a chip on which normal memory cells are formed. If some of the normal memory cells are found to be faulty, they are relieved by substituting them with the spare memory cells.

This kind of redundant configuration is conventionally employed in memory devices such as DRAMs (dynamic RAMs), SRAMs (static RAMs) and PROMs (programmable ROMs). However, the redundant configuration is generally not employed in mask ROMs. The reason of this will be explained.

A data writing process of the mask ROM is achieved during a wafer manufacturing stage. After the manufacturing, the mask ROM is tested for its electrical characteristics such as data read characteristics. In the testing, it is impossible to rewrite data already written in the mask ROM. Namely, even if some of normal memory cells of the manufactured mask ROM are found to be defective, it is impossible to write the same data stored in the defective normal memory cells to spare memory cells and to electrically switch the defective cells to the spare cells.

To relieve the defective normal memory cells of the mask ROM, it is necessary to provide spare memory cells to which data can be written even after the completion of manufacturing processes and which can hold the written data with no electrical supply. This sort of spare memory cells may be transistors provided with floating gates as those employed in PROMs, or memory cells provided with fuses.

However, manufacturing processes of the spare memory cells formed of transistors with floating gates are complicated, compared with manufacturing processes of MOS transistors of mask ROMs. This may unbearably increase manufacturing costs of the spare memory cells.

Meanwhile, the spare memory cells with fuses are classified into three types depending on ways of disconnecting the fuses to program data write.

A first type cuts off the fuses with laser. This type requires an exclusive cutting apparatus having a function of correctly aligning positions to be cut and, therefore, the fuses shall be spaced apart from each other by a certain distance that cannot be minimized. In addition, it takes a long time to align the cutting positions, and it is necessary to inspect electrical characteristics of the memory cells before and after cutting the fuses. This also takes a time. Namely, the first type needs a lot of processes in switching defective memory cells to the spare memory cells, thus deteriorating productivity.

A second type uses a current from a bipolar transistor to fuse a current fuse. The bipolar transistors involved in this second type require different manufacturing processes from manufacturing processes of MOS transistors of a mask ROM. This may complicate the manufacturing processes of mask ROMs and increase the number of processes and the manufacturing costs.

A third type connects a MOS transistor to a fuse in series and melts the fuse by an ON current from the MOS transistor. This third type does not require different manufacturing processes and exclusive facilities. However, to melt the fuse, it is necessary to provide a current of several 10 mA so that the MOS transistor shall have a very large channel width in the range of for instance, 0.5 to 1.0 μm. This may increase an area occupied by the MOS transistor. Namely, a chip area shall be increased if many spare memory cells are going to be disposed on the chip.

To provide redundancy for mask ROMs, spare memory cells of the above-mentioned structures shall be arranged. However, these structures have drawbacks that they need different and complicated manufacturing processes, that they occupy large area on a chip, and that they deteriorate productivity. These are the reasons why the redundant configuration for faulty memory cells is not employed in the mask ROMs.

SUMMARY OF THE INVENTION

To solve these drawbacks of the conventional techniques, an object of the invention is to provide a semiconductor memory device that is excellent in its productivity and can easily relieve defective memory cells through redundant configuration that requires no expansion of a chip area.

Another object of the invention is to provide spare semiconductor memory cells that can be manufactured through the same processes as those for manufacturing normal memory cells and do not require large areas to occupy.

Still another object of the invention is to provide redundant configuration for a mask ROM, the redundant configuration comprising spare semiconductor memory cells each provided with a fuse that is fused by a current form a MOS transistor having a short channel width.

In order to accomplish the objects and advantages mentioned in the above, the present invention provides spare memory cells each comprising a read FET (Field Effect Transistor), a fusing FET and a current fuse. The FETs are connected in series between a read data line and a low voltage source. The fuse is inserted between a series node of the FETs and a write data line. The fuse is molten when data is written on the spare memory cell. By applying a power source voltage to a control electrode of the fusing FET and by applying a voltage that is higher than the power source voltage to the write data line, the fusing FET is set to a snap back action, namely its secondary breakdown state. Under this state, a large current flows through the fusing FET to cut off the fuse, thus writing data to the spare memory cell. Namely, the fusing FET that has a short channel width and occupies a small area is sufficient to provide the large current to cut off the fuse.

Another aspect of the invention provides a semiconductor memory device which comprises a group of normal memory cells and a group of spare memory cells. Each of the spare memory cells comprises a read FET (Field Effect Transistor) and a fusing FET that are connected in series between a read data line and a low voltage source, and a current fuse inserted between a series node of the FETs and a write data line. The spare memory cells will substitute for faulty ones of the normal memory cells.

The semiconductor memory device further comprises first selection means for selecting a memory cell among the group of normal memory cells to read data from the selected normal memory cell; second selection means for selecting a memory cell among the group of spare memory cells to read data from the selected spare memory cell; switching means for selectively outputting data read out of the normal memory cell selected by the first selection means or data read out of the spare memory cell selected by the second selection means; and writing means for writing data to the group of spare memory cells and for controlling the second selection means such that the second selection means selects, based on addresses identifying the group of normal memory cells, the spare memory cells that substitute for the normal memory cells.

The second selection means comprises memory cells that are NORed to each other, each of the NORed memory cells comprising a read FET (Field Effect Transistor) and a fusing FET that are connected in series between a read data line and a low voltage source and a current fuse inserted between a series node of the FETs and a write data line.

These and other objects, features and advantages of the present invention will be more apparent from the following detailed description of preferred embodiments in conjunction with the accompanying drawings.

BRIEF DESCRIPTION OF THE DRAWINGS

FIG. 4 is a timing chart showing operations of the semiconductor memory device shown in FIG. 3.

DETAILED DESCRIPTION OF THE EMBODIMENTS

Figure 1:
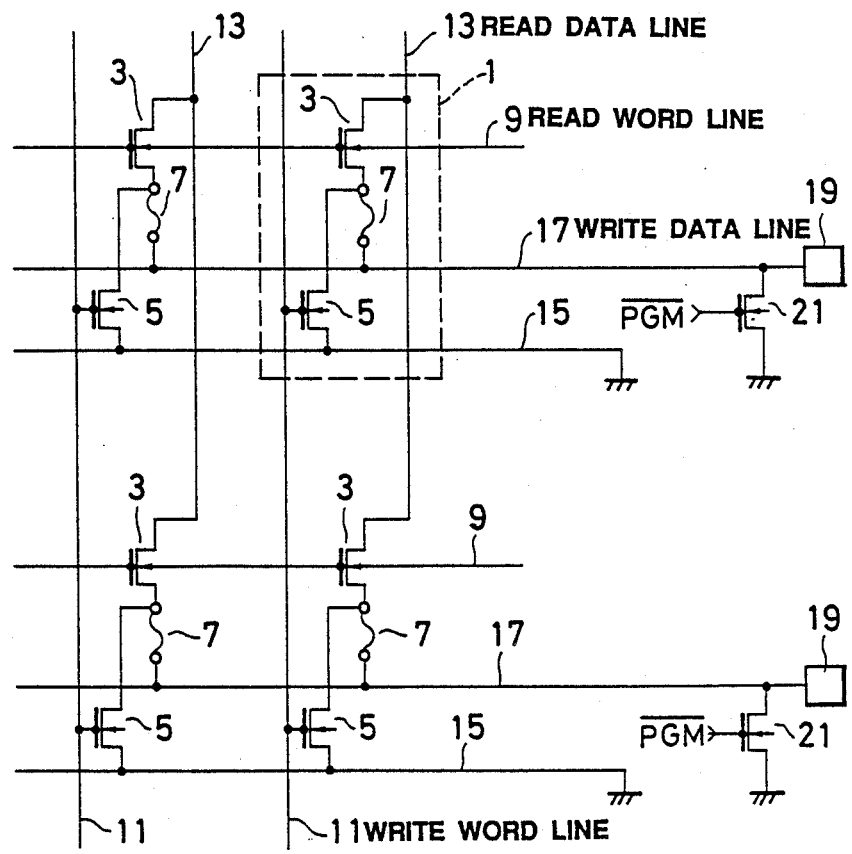
FIG. 1 is a circuit diagram showing semiconductor memory cells according to an embodiment of the invention.

FIG. 1 is a circuit diagram showing semiconductor memory cells according to an embodiment of the invention. The semiconductor memory cells are used as spare memory cells of a mask ROM.

In the figure, a memory cell 1 comprises a read only N-channel MOS (NMOS) transistor 3, a fusing NMOS transistor 5, and a current fuse 7. A number of the memory cells 1 are arranged in matrix on a semiconductor chip.

The NMOS transistor 3 may be 2 $\mu$m in channel width, 2 $\mu$m in channel length, 4000 Å in the film thickness of its gate electrode and 200 Å in the thickness of its gate oxidized film. A gate terminal of the NMOS transistor 3 is connected to a read word line 9. The NMOS transistor 3 becomes conductive when data is read.

The NMOS transistor 5 may be 7 $\mu$m in channel width, 1.0 $\mu$m in channel length, 4000 Å in the film thickness of its gate electrode and 200 Å in the thickness of its gate oxidized film. A gate terminal of the NMOS transistor 5 is connected to a write work line 11. The NMOS transistor 5 becomes conductive when data is written.

Figure 2:
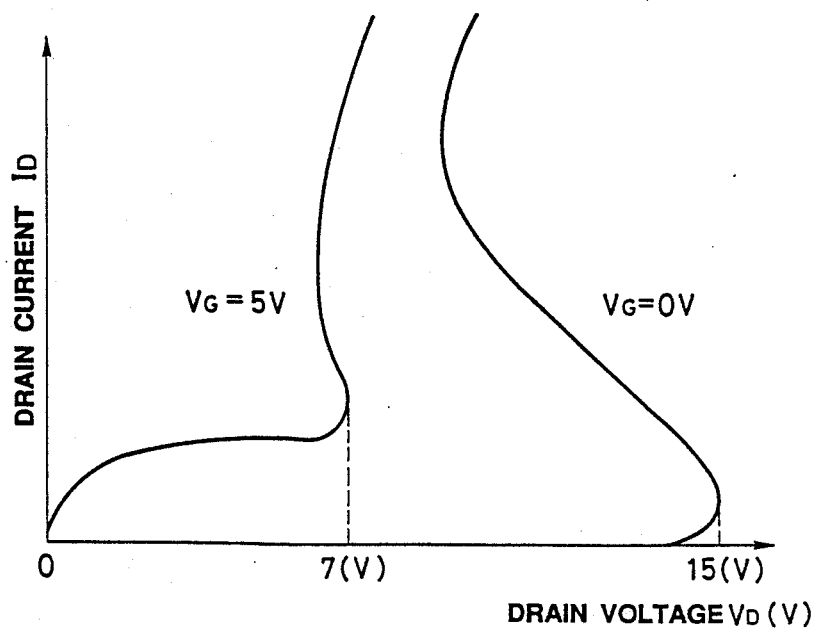
FIG. 2 is a view showing characteristic curves of a MOS transistor for melting a fuse disposed in each memory cell of FIG. 1.

FIG. 2 shows characteristics of drain voltages (VD) and drain currents (ID) of the NMOS transistor 5. As shown in FIG. 2, when a source voltage of about 5 V is applied as a gate voltage (VG) of the transistor 5 is about 7 V to cause a snap back action, namely secondary breakdown. Under this state, a large current of about 80 mA flows through the NMOS transistor 5. In FIG. 2, the NMOS transistor 5 demonstrates a drain resistive voltage of about 15 V when its gate terminal is at ground voltage.

The NMOS transistors 3 and 5 are connected in series between a read data line 13 and a wiring 15 that is grounded. To a series node of the transistors 3 and 5, one end of a fuse 7 is connected. The other end of the fuse 7 is connected to a write data line 17.

The fuse 7 is made of polycrystalline silicon of 4000 Å in thickness, same as the thickness of the gate electrode of any of the transistors 3 and 5. A narrowed portion of the fuse 7 is 0.8 $\mu$m in width and 2 $\mu$m in length. Contact portions of the fuse 7 with respect to the series node of the transistors 3 and 5 and the write data line 17 are each 2 $\mu$m × 2 $\mu$m.

Namely, the NMOS transistor 3 is 2 $\mu$m in channel width and 2 $\mu$m in channel length, the NMOS transistor 5 being 7 $\mu$m in channel width and 1.0 $\mu$m in channel length, and the fuse 7 being 7 $\mu$m in length and 3 $\mu$m in width at maximum. Therefore, each memory cell 1 has the size of about 140 $\mu$m$^2$ (20 $\mu$m × 7 $\mu$m) to reduce its occupying area.

The write data line 17 to which the other end of the fuse 7 is connected is connected to, at its one end, a pad 19. The pad 19 receives external electric power to melt down the fuse 7. The fusing voltage applied to the pad 19 is lower than a drain resistive voltage of the NMOS transistor 5 with its gate voltage at ground voltage and higher than a secondary breakdown voltage of the NMOS transistor 5 with its gate voltage at power source voltage to put the NMOS transistor 5 in the secondary breakdown state.

An NMOS transistor 21 is connected between the write data line 17 and the ground. The NMOS transistor 21 becomes conductive in response to a program signal ($\overline{PGM}$). To write data to the memory cell 1, the program signal is set to a low level to turn off the NMOS transistor 21. To read data from the memory cell 1, the program signal is set to a high level to turn on the NMOS transistor 21 to set the write data line 17 to the ground voltage.

The write data line 17 and wiring 15 extend in parallel with each other and are made of metal. The read data line 13 is made of polycrystalline silicon, N-type or P-type diffusion layer, high melting point metal silicide, metallic double layer structure that is different from the write data line 17 and wiring 15, or composite of them.

Data writing and reading operations of the memory cell 1 will be explained.

Data is written to the memory cell 1 by melting down the fuse 7. For this, the program signal is set to a low level to turn off the NMOS transistor 21. A fusing voltage of about 12 V is applied to the pad 19 of the write data line 17 connected to the fuse 7 to be fused. Then, a power source voltage of about 5 V is applied to the write word line 11 that is connected to the memory cell 1 containing the fuse 7 to be cut off.

As a result, the NMOS transistor 5 is put under its secondary breakdown state so that a large current flows through a path formed of the pad 19, write data line 17, fuse 7, NMOS transistor 5 and the ground. Accordingly, the fuse 7 is molten so that the series node of the NMOS transistors 3 and 5 of the memory cell 1 is disconnected from the write data line 17 to complete the data writing operation.

Next, the reading operation will be explained.

The program signal is firstly set to a high level to turn on the NMOS transistor 21. The read work line 9 connected to the memory cell 1 from which data is to be read is set to a high level to turn on the NMOS transistor 3. If the fuse 7 of the memory cell 1 is not disconnected, the read data line 13 connected to the NMOS transistor 3 that has been turned on is grounded through the fuse 7, write data line 17 and NMOS transistor 21. Accordingly, the read data line 13 is set to a low level, and data of low level is read out of the memory cell 1.

If the fuse 7 of the memory cell 1 has already been fused, i.e., if the fuse 7 is disconnected, the read data line 13 is maintained at a high level that is a state before starting the reading operation. As a result, data of high level is read out of the memory cell 1.

In this way, the fuse 7 of the memory cell 1 of FIG. 1 is fused by the NMOS transistor 5. To fuse the fuse 7, the transistor 5 is put in its secondary breakdown state. Then, even with its short channel width, the NMOS transistor 5 provides a large fusing current. Namely, the spare memory cell 1 including the fuse 7 and the transistor 5 for melting the fuse 7 occupies only a small area in a chip on which the cell 1 is arranged.

Since the fuse 7 is molten with the large current, its melting time is short. Therefore, for memory cells of about 2 K-bits each of the above-mentioned structure, a writing operation may be completed within a short time of about 0.1 seconds.

This writing operation can be done at the time of inspection of electrical characteristics of normal memory cells after a wafer manufacturing stage with no exclusive facilities.

Therefore, the memory cells 1 will be optimum as spare memory cells foe forming the redundancy of mask ROM. By employing such spare memory cells, faulty ones of normal memory cells of the mask ROM can practically be relieved.

Figure 3:
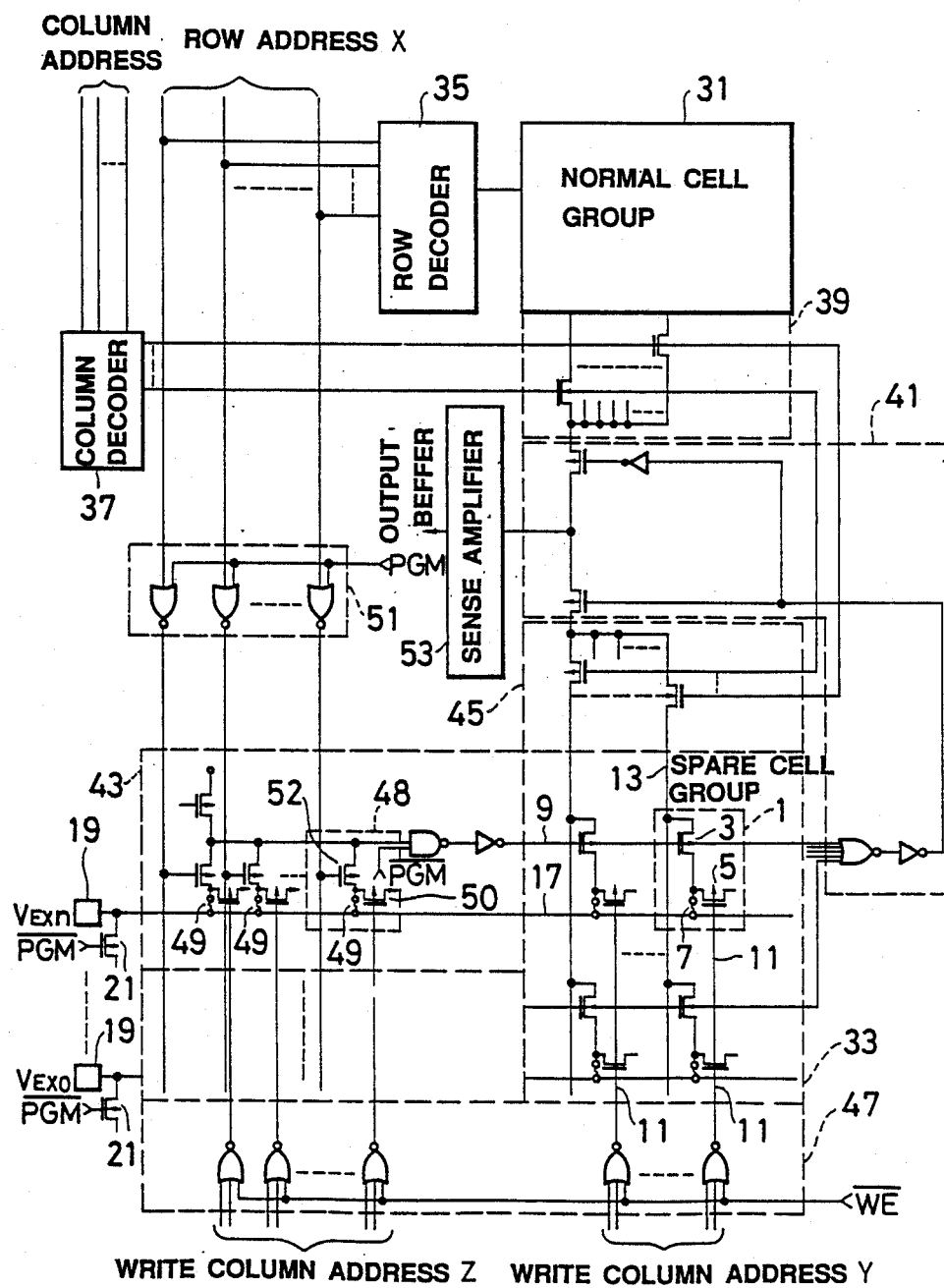
FIG. 3 is a circuit diagram showing a semiconductor memory device of redundant configuration employing the memory cells shown in FIG. 1.

The mask ROM of redundant configuration employing such memory cells 1 as spare memory cells will be explained with reference to FIGS. 3 and 4, in which FIG. 3 is a view showing an arrangement of the mask ROM and FIG. 4 a timing chart of writing operation.

The mask ROM comprises a group 31 of normal memory cells and a group 33 of spare memory cells that will substitute for faulty ones of the normal memory cells, if any. Elements shown in FIGS. 3 represented with the same reference marks as those shown in FIG. 1 provide like functions so that their explanations will be omitted.

In FIG. 3, the normal memory cells in the group 31 are selected by a row decoder 35 and a column selector 39. The row decoder 35 decodes row addresses of the normal memory cells, while the column selector 39 is controlled by outputs of a column decoder 37 that decodes column addresses of the normal memory cells. Data read out of a selected normal memory cell in the group 31 is given to a switching circuit 41 via the column selector 39.

The switching circuit 41 selectively outputs data from the group 31 of normal memory cells or data from the group 33 of spare memory cells.

Faulty memory cells among the normal memory cells are replaced by the spare memory cells column by column. Each of the spare memory cells in the group 33 has the same arrangement as the memory cell 1 shown in FIG. 1.

The group 33 of spare memory cells is connected with a column decoder 47, a spare row decoder 43 and a spare column selector 45. The column decoder 47 controls writing operation of the group 33 of spare memory cells as well as controlling writing operation of the spare row decoder 43. The spare row decoder 43 controls reading operation of the group 33 of spare memory cells according to addresses written under the control of the column decoder 47 and according to row addresses X.

The spare column selector 45 selects a column of data read out of the spare memory cells, based on a column address sent from the column decoder 37.

Operation of the mask ROM of such redundant configuration as shown in FIG. 3 will be explained.

If a faulty memory cell is found in the group a testing apparatus, data to be written to the faulty memory cell will be written to a certain spare memory cell 1 in the group 33. To do so, a write column address Y is given to the column decoder 47 to identify a certain column of the spare memory cell group 33 that includes the certain spare memory cell 1. At the same time, a write signal WE of low level is given to the column decoder 47 so that an NMOS transistor 5 of every memory cell in the certain column identified by the column address Y may be turned on.

At this moment, a program signal $\overline{\text{PGM}}$ of low level is given to a certain row that corresponds to the certain spare memory cell 1, to turn off an NMOS transistor 21 of the certain row. Accordingly, a fusing voltage from a pad 19 of the certain row is applied to a drain of the NMOS transistor 5 of the certain spare memory cell 1 to put the NMOS transistor 5 of the certain spare memory cell 1 in its secondary breakdown state. This causes a large fusing current to flow through the NMOS transistor 5 of the certain spare memory cell 1 to melt, i.e., cut off a fuse 7 of the certain spare memory cell 1, thereby writing the data to the certain spare memory cell 1 in the group 33 of spare memory cells.

FIG. 4 is a timing chart showing respective signals of the writing operation of the spare memory cell.

Next, a data reading operation of the spare memory cell group 33 to which data have been written in the manner mentioned in the above will be explained.

In this case, a certain spare memory cell that substitutes for a faulty normal memory cell shall be identified by a row address X that is for identifying the faulty normal memory cell. To realize this, the embodiment is provided with memory cells 48 that are NORed. Each memory cell 28 is identical to the memory cell 1 of the group 33. The memory cells 48 constitute the spare row decoder 43.

When data is written to one spare memory cell 1, it is necessary to identify this one spare memory cell 1. To do so, a write column address Z is given to the column decoder 47. This column address Z corresponds to a column address of the one spare memory cell 1 to which the data has been written. At the same time, a write signal $\overline{WE}$ of low level is given to the column decoder 47. Then, an NMOS transistor 50 of every memory cell 48 in one column identified by the column address Z is turned on.

At this moment, a program signal $\overline{PGM}$ of low level is given to one row that corresponds to the one spare memory cell 1 to which the data has been written, to turn off an NMOS transistor 21 connected to the one row. As a result, a fusing voltage from a pad 19 of the one row is applied to a drain of the NMOS transistor 50 of one memory cell 48 that is located in the one row and in the one column identified by the column address Z, to put the NMOS transistor 50 in its secondary breakdown state. This causes a large fusing current to flow through the NMOS transistor 50 to melt, i.e., cut off a fuse 49 connected to the NMOS transistor 50, thus storing the address data in the one memory cell 48.

While an address is being written to any of the memory cells 48, a program signal PGM is given to a row address gate 51 to set an input row address X to a low level so that NMOS transistors 52 of the memory cells 48 are turned off.

When the address data is stored in the memory cell 48, the program signal PGM to the row address gate 51 is stopped so that the row address X is supplied through the row address gate 51 to a gate of the NMOS transistor 52 of each memory cell 48. Address data held in the memory cells 48 are supplied to respective read word lines 9 of the group 33 of spare memory cells. Then, data held in the group 33 of spare memory cells are read out. The read data are transferred to the spare column selector 45. The spare column selector 45 selects a column of the read data according to a column address given to it through the column decoder 37, and the data selected in the spare column selector 45 is sent to the switching circuit 41.

The switching circuit 41 follows an OR output of the spare row decoder 43 to select data read out of one normal memory cell i the group 31 or the data read out of the spare memory cell. Namely, if the spare row decoder 43 selects a spare memory cell according to a given row address, the switching circuit 41 is controlled to select data read out of the spare memory cell. The selected data is given to a sense amplifier 53 that amplifies the data and gives it to an output buffer from which the data is outputted.

The spare memory cells 1 of the mask ROM of redundant configuration can easily substitute for faulty normal memory cells. In addition, the spare row decode 43 can be constituted with memory cells that are identical to the spare memory cells 1, and the fuses 49 of the spare row decoder 43 are fused to provide a decoder function. With this arrangement, the spare row decoder 43 can easily select a spare memory cell that substitute for a faulty normal memory cell according to a row address that is for identifying the faulty normal memory cell.

The memory cells according to the invention are applicable not only for the example explained in the above but also for spare row decoders of DRAMs and SRAMs. Also the invention is applicable for writing information on a chip after the chip is formed. Namely, the invention is applicable for a logic circuit in which an input logic is determined after the formation of a related chip, a redundancy signature circuit for judging whether or not redundancy is achieved, or a programmable logic device (PLD).

As described in the above, according to the invention, a FET (Field Effect Transistor) is set to its secondary breakdown state to flow a current through the FET and melt down a fuse with that current to write data. As a result, memory cells of the invention have excellent productivity and occupy small areas. These memory cells are used as spare memory cells to form the redundancy of a semiconductor memory device. This sort of a semiconductor memory device can be manufactured without enlarging a chip area and through simple processes, and it is possible to relieve defective memory cells within a short time with no exclusive facilities.

Various modifications will become possible for those skilled in the art after receiving the teachings of the present disclosure without departing from the scope thereof.

What is claimed is:

1. A semiconductor memory cell comprising:
   (a) a read FET (Field Effect Transistor) and a fusing FET that are connected in series between a read data line and a low voltage source; and
   (b) a current fuse inserted between a series node of said FETs and a write data line, said fuse being fused to write data to said read FET.

2. The semiconductor memory cell as claimed in claim 1, wherein, when the data is written, predetermined voltage is applied to a control electrode of said fusing FET, and voltage that is higher than the predetermined voltage is applied to the write data line to put said fusing FET in a snap back action to provide a current, which fuses said current fuse.

3. The semiconductor memory cell as claimed in claim 1, wherein the read data line is formed of any one of polycrystalline silicon, diffusion layer, high melting point metal silicide, metallic layer different from a wiring layer forming the write data line, and at least two of them.

4. The semiconductor memory cell as claimed in claim 1, wherein the semiconductor memory cell is used as a spare memory cell to configure redundancy of a semiconductor memory device to substitute for a faulty normal memory cell of the semiconductor memory device.

5. A semiconductor memory cell comprising:
   (a) a read FET (Field Effect Transistor), a drain terminal of said read FET being connected to a read data line while a gate terminal of said read FET being connected to a read work line;
   (b) a fusing FET, a drain terminal of said fusing FET being connected to a source terminal of said read FET, a gate terminal of said fusing FET being connected to a write work line, and a source terminal of said fusing FET being connected to a low voltage source; and
   (c) a current fuse, one end of said current fuse being connected to a node between the source terminal of said read FET and the drain terminal of said fusing FET, while the other end of said current fuse being connected to a write data line to which predetermined voltage is applied when data is written to said read FET.

6. The semiconductor memory cell as claimed in claim 5, wherein, when the data is written to said read FET, the predetermined voltage is applied though the write word line to the gate terminal of said fusing FET while predetermined voltage is applied through the write data line and said current fuse to the drain terminal of said fusing FET so that said fusing FET is put a snap back action to provide a large current that fuses said current fuse to write the data to said read FET.

7. The semiconductor memory cell as claimed in claim 6, wherein the predetermined voltage applied through the write data line is lower than a drain resistive voltage of said fusing FET with its gate voltage at ground voltage and higher than a secondary breakdown voltage with the gate voltage at a power source voltage.

8. The semiconductor memory cell as claimed in claim 6, further comprising:
switching means connected to the write work line and connecting, when data is read, the write word line to the low voltage source in response to a program signal.

9. A semiconductor memory device comprising:
(a) a group of normal memory cells;
(b) a group of spare memory cells to substitute for faulty normal memory cells of said group of normal memory cells, each of the spare memory cells comprising a read FET (Field Effect Transistor) and a fusing FET that are connected in series between a read data line and a low voltage source, and a current fuse inserted between a series node of the FETs and a write data line, the current fuse being fused when data is written to the read FET;
(c) first selection means for selecting a memory cell from which data is to be read, among said group of normal memory cells;
(d) second selection means for selecting a memory cell from which data is to be read, among said group of spare memory cells;
(e) switching means for selectively outputting one of the data read out of the normal memory cell selected by said first selection means and the data read out of the spare memory cell selected by said second selection means;
(f) writing means for writing data to said group of spare memory cells and for controlling said second selection means such that said second selection means selects any one of said spare memory cells that substitutes for faulty one of said normal memory cells according to an address that is for identifying the one faulty normal memory cell.

10. The semiconductor memory cell as claimed in claim 9, wherein said second selection means comprises memory cells that are NORed to each other, each of the NORed memory cells comprising a read FET (Field Effect Transistor) and a fusing FET that are connected in series between a read data line and a low voltage source and a current fuse inserted between a series node of the FETs and a write data line.

* * * * *